United States Patent
Gao et al.

(10) Patent No.: US 10,334,763 B2
(45) Date of Patent: Jun. 25, 2019

(54) METHOD FOR PROVIDING COOLING TO ELECTRONIC RACKS USING LIQUID COOLING AND AIR COOLING

(71) Applicant: Baidu USA LLC, Sunnyvale, CA (US)

(72) Inventors: Tianyi Gao, Santa Clara, CA (US); Yan Cui, San Jose, CA (US)

(73) Assignee: BAIDU USA LLC, Sunnyvale, CA (US)

(*) Notice: Subject to any disclaimer, the term of this patent is extended or adjusted under 35 U.S.C. 154(b) by 0 days.

(21) Appl. No.: 15/811,552

(22) Filed: Nov. 13, 2017

(65) Prior Publication Data
US 2019/0150326 A1 May 16, 2019

(51) Int. Cl.
H05K 7/20 (2006.01)
(52) U.S. Cl.
CPC ..... *H05K 7/20836* (2013.01); *H05K 7/20172* (2013.01); *H05K 7/20218* (2013.01)
(58) Field of Classification Search
CPC .................................................. H05K 7/20836
USPC ....................................................... 361/696
See application file for complete search history.

(56) References Cited

U.S. PATENT DOCUMENTS

2009/0056910 A1* 3/2009 Mallia ................ H05K 7/20754
165/80.3
2015/0316334 A1* 11/2015 Chainer .................. G06F 1/206
165/287

* cited by examiner

*Primary Examiner* — Mukundbhai G Patel
(74) *Attorney, Agent, or Firm* — Womble Bond Dickinson (US) LLP (57) ABSTRACT

An electronic rack includes computing nodes arranged in a stack. Each computing node includes electronics which are liquid cooled using liquid cold plates and air cooled using fans. The electronic rack further includes cooling fans, each corresponding to a computing node to provide air cooling to the computing node. The electronic rack further includes a pair of rack supply manifold and rack return manifold, and an air-to-liquid (A/L) heat exchanger. The rack supply manifold receives cooling liquid from a coolant distribution unit (CDU). The rack return manifold receives and returns warmer liquid carrying the heat back to the CDU. The A/L heat exchanger is connected to the rack liquid supply. The rack supply manifold receives the cooling liquid from the A/L heat exchanger, then to distribute the cooling liquid to each computing node to provide liquid cooling to processors.

19 Claims, 8 Drawing Sheets

METHOD FOR PROVIDING COOLING TO ELECTRONIC RACKS USING LIQUID COOLING AND AIR COOLING

FIELD OF THE INVENTION

Embodiments of the present invention relate generally to data centers. More particularly, embodiments of the invention relate to providing cooling to electronic racks of a data center.

BACKGROUND

Heat removal is a prominent factor in a computer system and data center design. The number of high performance electronics components such as high performance processors packaged inside servers has steadily increased, thereby increasing the amount of heat generated and dissipated during the ordinary operation of the servers. With the fast development of artificial intelligence, big data, cloud computing related business and applications, the high performance computing (HPC) becomes more and more important. Thermal management for these high density servers and electronic racks become a challenge.

Energy efficiency in data centers is becoming more and more critical. Cooling system consumes a significant portion of the energy, by cooling fans, blowers, pumps, and chiller compressors. The energy required to operate the air cooling system may increase dramatically with an increase of rack density, which makes the high-density server and rack thermal management is a challenge.

In some applications, especially in data centers, due to the very different requirements from different customers, the rack design, rack density, rack configuration and rack functions are in different. It is a challenge to arrange these racks in the same room or arranged in a cold aisle-hot aisle fashion. The racks adjacent with each may have significant impact on each other. The airflow management is a challenge.

Traditional air cooling may not satisfy the cooling requirement for high density racks. In addition, traditional air cooling systems consume a great amount of energy. The traditional air cooling either use a computer room air handler (CRAH), computer room air conditioner (CRAC), rear door heat exchanger (RDHX), or any other type of solution may not be able to provide sufficient cooling air flow rate in this situation due to the capability limitation of the fans and blowers. Another type of exiting solution is the immersion cooling which the rack is designed as a cooling fluid tank and the entire information technology (IT) equipment are populated within the tank. This solution extracted all the heat to the liquid. However, this solution has several shortfalls and unsolved issues which make it difficult to deploy, such as high cost, long term reliability, operation and serviceability, and IT compatibilities.

BRIEF DESCRIPTION OF THE DRAWINGS

Embodiments of the invention are illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Reference in the specification to "one embodiment" or "an embodiment" means that a particular feature, structure, or characteristic described in conjunction with the embodiment can be included in at least one embodiment of the invention. The appearances of the phrase "in one embodiment" in various places in the specification do not necessarily all refer to the same embodiment.

Accordingly, embodiments of the invention provide a rack level cooling design, which is enabled to extract almost 100% of the heat generated within an electronic rack. The design includes a rack level liquid cooling and a server level liquid cooling. A server is also referred to as a computing node that operates as a server therein. The liquid supply line comes into the electronic rack going to an air-to-liquid (A/L) heat exchanger first (referred to as rack level cooling) and then goes to a rack level manifold. The manifold distributes cooling liquid to individual server loop which has server level cooling devices assembled, such as cold plates. The A/L heat exchanger is used to cool the electronic rack level air recirculated within the electronic rack. The air recirculates only within the electronic rack and cools the electronic components of the servers (e.g., motherboard, memory, storage devices), which are not liquid cooled. The air cooling is also to remove a portion of heat generated by the components (e.g., processors) that are liquid cooled but cannot remove all of the heat. Most or all the heat is extracted to the liquid and transferred out of the electronic rack through liquid.

In one embodiment, an electronic rack includes a housing to house a number of computing nodes (e.g., servers) arranged in a stack, each computing node including at least one processor attached to a liquid cold plate. The electronic rack further includes a number of cooling fans. Each cooling fan corresponds to at least one of the computing nodes to provide air cooling to the corresponding computing node. Each cooling fan generates an airflow flowing through an airspace of the computing node. The electronic rack further includes a pair of rack supply manifold and rack return manifold, and an A/L heat exchanger. The rack supply manifold is to receive cooling liquid from a coolant distribution unit (CDU), where the CDU may be located external to the electronic rack or a local CDU within the electronic rack. The rack return manifold is to receive and return warmer liquid carrying at least a portion of heat from the computing node back to the CDU. The A/L heat exchanger is coupled to the rack supply manifold to receive the cooling liquid, to exchange the heat carried by the airflows moving by the cooling fans, and then to distribute the cooling liquid to each of the computing nodes to provide liquid cooling to one or more corresponding processors via the respective corresponding liquid cold plates.

According to another embodiment, the electronic rack further includes a bypass mechanism coupled to the rack supply manifold to receive the cooling liquid from the rack supply manifold and to provide the cooling liquid directly to the computing nodes without going through the A/L heat exchanger. The bypass mechanism is invoked when the A/L heat exchanger is disconnected from the rack supply manifold, for example, for maintenance purposes. That is when the A/L heat exchanger is disconnected from the rack supply manifold, the cooling liquid is then directly provided to the computing nodes, bypassing the A/L heat exchanger.

According to another embodiment, the housing includes a front panel and a back panel sandwich the stack of computing nodes in between. A front aisle is formed between the front panel and frontends of the computing nodes and a back aisle is formed between the back panel and the backends of the computing nodes. The cooling fans cause airflows to flow from the front aisle to the back aisle across the airspace of the computing nodes to exchange a certain portion of heat generated by the computing nodes. Warmer airflows carrying the exchanged heat travel through the back aisle and then enter the airspace of the A/L heat exchanger. Cooler airflows are then generated from the A/L heat exchanger due to the air-to-liquid heat exchange. The cooler airflows then travel through the front aisle and reenter the airspace of the computing nodes. Thus, the airflows are recirculated within the electronic rack and cooled via the A/L heat exchanger.

Figure 1:
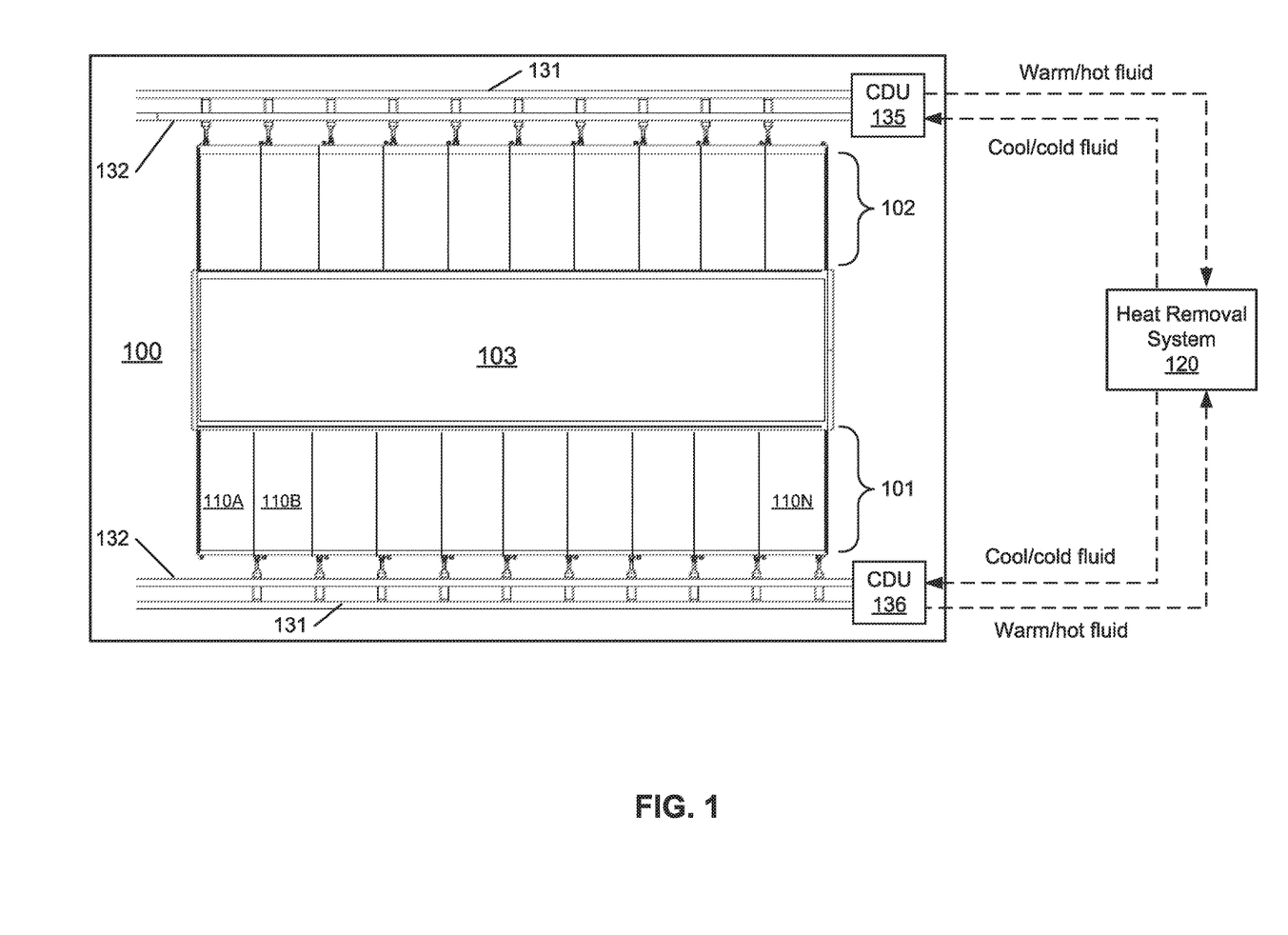
FIG. 1 is a block diagram illustrating an example of a data center facility according to one embodiment.

FIG. 1 is a block diagram illustrating an example of a data center or data center unit according to one embodiment. In this example, FIG. 1 shows a top view of at least a portion of a data center system, which is housed in a data center room or container. Referring to FIG. 1, according to one embodiment, data center system 100 includes one or more rows of electronic racks of IT components, equipment or instruments 101-102, such as, for example, computer servers or computing nodes that provide data services to a variety of clients over a network (e.g., the Internet). In this embodiment, each row includes an array of electronic racks such as electronic racks 110A-110N. However, more or fewer rows of electronic racks may be implemented. Typically, rows 101-102 are aligned in parallel with frontends facing towards each other and backends facing away from each other, forming aisle 103 in between to allow an administrative person walking therein. However, other configurations or arrangements may also be applied.

In one embodiment, each of the electronic racks (e.g., electronic racks 110A-110N) includes a housing to house a number of servers operating therein. Each electronic rack can include a pair of liquid supply and return manifolds, a number of server slots, and a number of server blades capable of being inserted into and removed from the server slots. Each server blade represents a computing node having one or more processors, a memory, and/or a persistent storage device (e.g., hard disk). At least one of the processors is attached to a liquid cold plate to receive liquid cooling. In addition, one or more cooling fans are associated with the server blades to provide air cooling to the computing nodes contained therein. Note that the heat removal system 120 may be coupled to multiple data center systems.

In one embodiment, heat removal system 120 includes an external liquid loop connected to a cooling tower or a dry cooler external to the building/housing container. The heat removal system 120 can include, but is not limited to evaporative cooling, free air, rejection to large thermal mass, and waste heat recovery designs. In one embodiment, each server blade is coupled to the liquid supply manifold and return manifold modularly such that a server blade can be removed from the electronic rack without affecting the operations of remaining server blades on the electronic rack and the liquid supply and return manifolds.

In one embodiment, the liquid supply and return manifolds are disposed on the backend of each electronic rack and are coupled to liquid supply line 132 to receive cooling liquid from heat removal system 120. The cooling liquid is distributed through a liquid distribution loop attached to a cold plate on which a processor is mounted to remove heat from the processors. A cold plate is configured similar to a heat sink with a liquid distribution tube or loop attached or embedded therein. The resulting warmer or hotter liquid carrying the heat exchanged from the processors is transmitted via return line 131 back to heat removal system 120. Liquid supply/return lines 131-132 are referred to as data center liquid supply/return lines (e.g., global liquid supply lines), which supply heat removal liquid to all of the electronic racks of rows 101-102.

Heat removal system 120 is coupled to a CDU such as CDUs 135-136 to form a primary loop, where the secondary loops of CDUs 135-136 are then coupled to the electronic racks 101-102 via supply line 132 and return line 131. Typically, a CDU includes a liquid-to-liquid heat exchanger. A liquid-to-liquid heat exchanger s a device that allows heat from a fluid (a liquid or a gas) to pass to a second fluid (another liquid or gas) without the two fluids having to mix together or come into direct contact. Typically, a liquid-to-liquid heat exchanger would have two liquid loops. A first liquid loop coupled to an upstream cooling system is referred to a primary loop, while a second liquid loop coupled to a downstream cooling system is referred to a secondary loop with respect to the CDU.

Figure 2A:
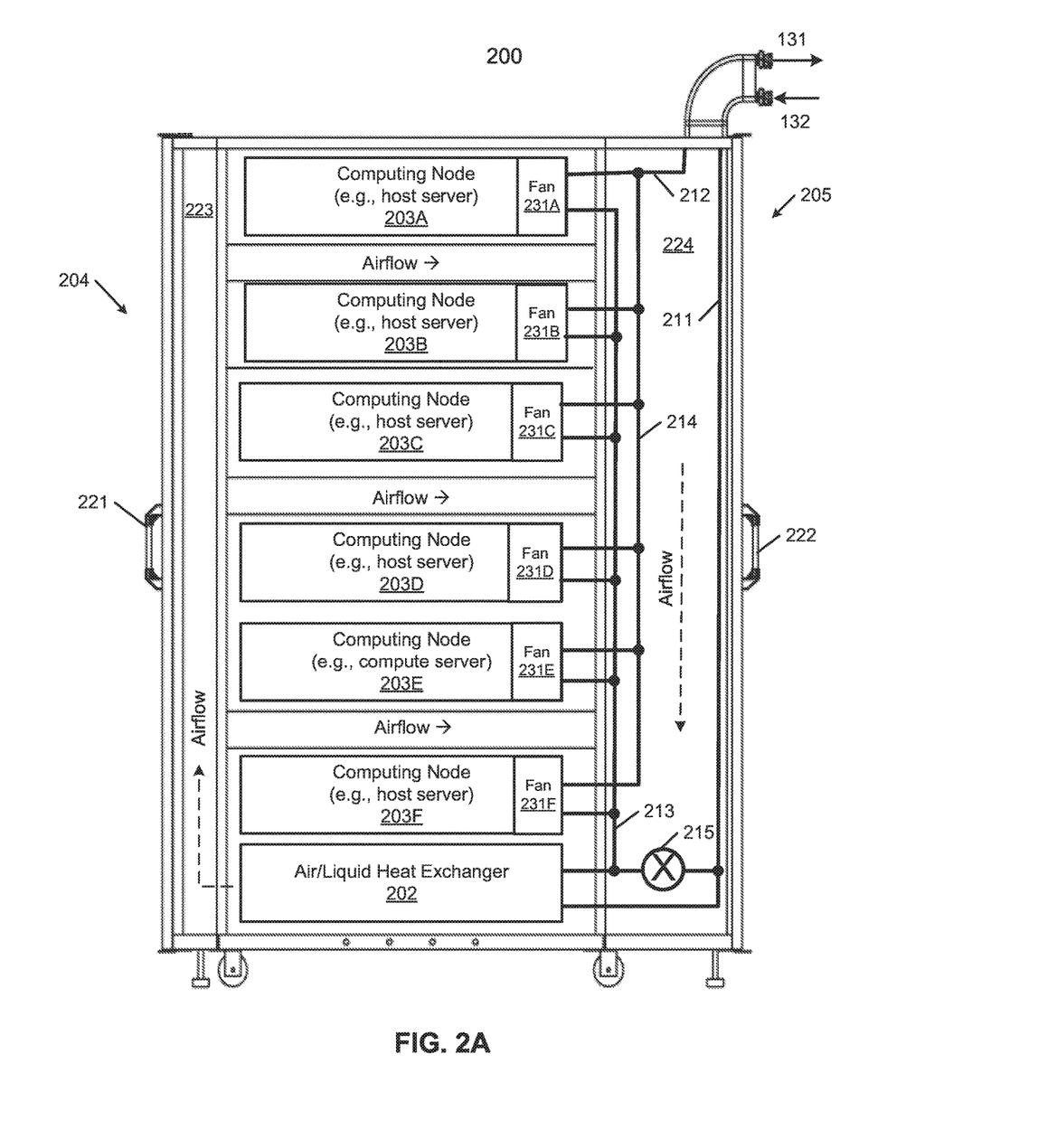
FIGS. 2A-2B are block diagrams illustrating an example of an electronic rack according to one embodiment.

FIG. 2A is a block diagram illustrating an electronic rack according to one embodiment. Electronic rack 200 may represent any of the electronic racks as shown in FIG. 1, such as, for example, electronic racks 110A-110N. Referring to FIG. 2A, according to one embodiment, electronic rack 200 includes, one or more server blades 203A-203F (collectively referred to as server blades 203) and an A/L heat exchanger 202. Each of server blades contains one or more computing nodes operating as servers therein. Server blades 203 can be inserted into an array of server slots respectively from frontend 204. Note that although there are only six server blades 203A-203F shown here, more or fewer server blades may be maintained within electronic rack 200. Also note that the particular positions of A/L heat exchanger 202 and server blades 203 are shown for the purpose of illustration only; other arrangements or configurations may also be implemented. For example, A/L heat exchanger 202 may be located at the top of the stack, similar to the location of server blade 203A.

Each of server blades 203 may include one or more IT components (e.g., central processing units or CPUs, graphical processing units (GPUs), memory, and/or storage devices). Each IT component may perform data processing tasks, where the IT component may include software installed in a storage device, loaded into the memory, and executed by one or more processors to perform the data processing tasks. Server blades 203 may include a host server (referred to as a host node) coupled to one or more compute servers (also referred to as computing nodes, such as CPU server and GPU server). The host server (having one or more CPUs) typically interfaces with clients over a network (e.g., Internet) to receive a request for a particular service such as storage services (e.g., cloud-based storage services such as backup and/or restoration), executing an application to perform certain operations (e.g., image processing, deep data learning algorithms or modeling, etc., as a part of a software-as-a-service or SaaS platform). In response to the request, the host server distributes the tasks to one or more of the computing nodes or compute servers (having one or more GPUs) managed by the host server. The compute servers perform the actual tasks, which may generate heat during the operations.

Figure 2B:
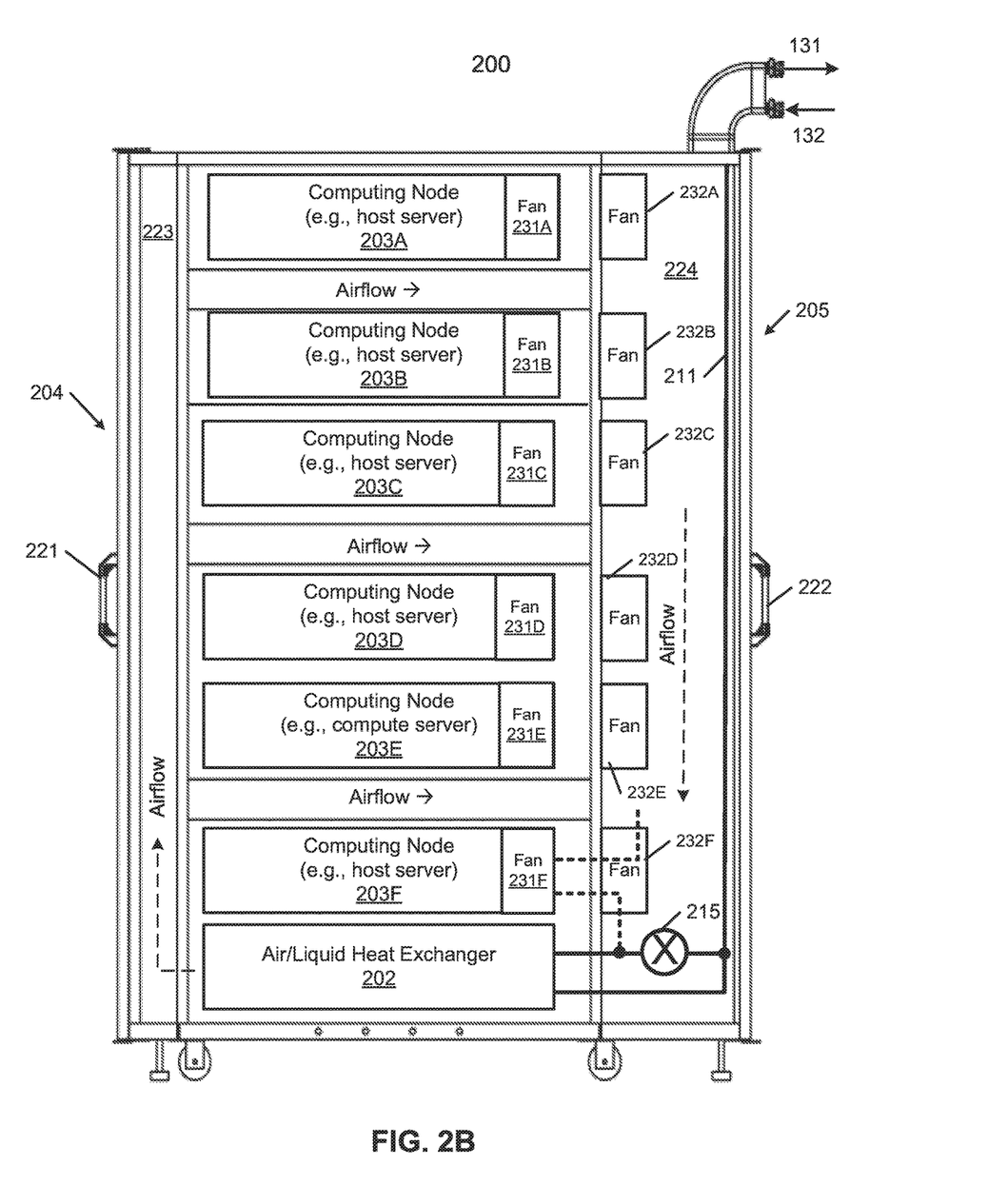

In addition, for each of the server blades 203, there is a fan module associated with the server blade. In this embodiment, fan modules 231A-231F, collectively referred to as fan modules 231, are associated with server blades 203A-203F respectively. In this example, each fan module is mounted on a backend of a server blade. Alternatively, the fan modules can be mounted on the backend of the electronic rack as shown in FIG. 2B (see e.g., fan modules 232A-232F, collectively referred to as fan modules 232). In a further embodiment, there are two sets of fan modules. A first set is mounted on the backends of the server blades 203A-203F while the second set is mounted on a support frame of the electronic rack (e.g., fan modules 231 and fan modules 232). Each of the fan modules 231 includes one or more cooling fans. Fan modules 231 may be configured to generate airflows flowing from frontend 204, traveling through the air space of the sever blades 203, and exiting at backend 205 of electronic rack 200. Note that in FIG. 2B, certain manifolds have been removed to show the cooling fan configuration.

According to one embodiment, electronic rack 200 includes a rack liquid supply line 211 (also simply referred to as a rack supply line) and a rack liquid return line 212 (also simply referred to as a rack return line). Rack supply line 211 is coupled to room supply manifold 132 to receive cooling liquid from a CDU. Room supply manifold 132 is configured to provide cooling liquid to other electronic racks in the room. Rack liquid return line 212 is coupled to room return manifold 131 to return warmer liquid back to a CDU, carrying the heat generated from the server blades.

In one embodiment, rack supply line 211 is coupled to an inlet or input port of A/L heat exchanger 202. The outlet or output port of A/L heat exchanger 202 is coupled to rack supply manifold 213 (also referred to as a server supply manifold). The A/L heat exchanger 202 receives the cooling liquid from rack supply line 211. The cooling liquid goes through the fins of the A/L heat exchanger 202 to exchange the heat carried by the airflows. The cooling liquid then exits the outlet of the A/L heat exchanger 202 to enter rack supply manifold 213. Rack supply manifold 213 is configured to supply the cooling liquid to each of computing nodes 203A-203F via a liquid distribution loop within each computing node (not shown). The cooling liquid supplied to each computing node may be warmer than the cooling liquid provided by rack supply line 211 as it carries a portion of the heat exchanged from the airflows.

In one embodiment, each liquid distribution loop associated with each computing node includes an inlet to receive the cooling liquid from rack supply manifold 213. The liquid distribution loop distributes the cooling liquid through at least some of the cold plates disposed on a motherboard of the computing node to exchange the heat generated by one or more processors attached onto the cold plates. The cooling liquid carrying the exchanged heat exits an outlet of each distribution loop to return the cooling liquid to rack return manifold 214, which in turn returns the cooling liquid to rack return line 212. Rack return line 212 then returns the liquid back to main return manifold 131, which also collects the liquid from other electronic racks in the data center and returns the liquid back to one or more CDUs.

In one embodiment, each server blade is coupled to rack supply manifold 213 and rack return manifold 214 through a quick-release connectors. A quick connect fitting, also called a quick disconnect or quick release coupling, is a coupling used to provide a fast, make-or-break connection of fluid transfer lines. Operated by hand, quick connect fittings replace threaded or flanged connections, which require wrenches. When equipped with self-sealing valves, quick connect fittings will, upon disconnection, automatically contain any fluid in the line.

Each server blade can be inserted into or removed from a frontend of a corresponding server slot. Each server blade can be connected to or disconnected from rack supply manifold 213 and rack return manifold 214 via a corresponding pair of quick-release connectors. Similarly, A/L heat exchanger 202 can also be inserted into and removed from a frontend of a heat exchanger slot. A/L heat exchanger 202 can also be coupled to rack supply line 211 and rack supply manifold 213 using a pair of quick-release connectors. Each of server blades 203A-203F and A/L heat exchanger 202 can be inserted and removed without affecting the operations of the remaining components in the electronic rack.

In one embodiment, the housing enclosing the stack of server blades 203A-203F of electronic rack 200 includes a front panel 221 and a back panel 222, which may operating as a front door or window and a back door or window, respectively. Front panel 221 and back panel 222 sandwich the stack of server blades 203A-203F in between, forming a front aisle 223 and a back aisle 224. Cooling fan modules 231A-231F (and/or cooling fan modules 241A-241F of FIG. 2B) cause airflows flowing across the airspace of server blades 203A-203F to exchange the heat generated from the server blades 203A-203F. The warmer airflows carrying the exchanged heat then enter back aisle 224 and due to the enclosed environment, the airflows travel towards A/L heat exchanger 202 to conduct an A/L heat exchange process using cooling liquid provided by rack supply line 211. As a result, cooler airflows are transformed from the warmer airflows and enter front aisle 223. The cooler airflows then reenter the airspaces of server blades 203A-203F, forming an air circular loop. Thus, with a combination of liquid-to-liquid cooling and air-to-liquid cooling, most or all of the heat generated by server blades 203A-203F can be removed.

In this example, since A/L heat exchanger 202 is located at the bottom of the electronic rack, the airflow within front aisle 223 flows upwardly, while the airflow within back aisle 224 flows downwardly. However, according to another embodiment, A/L heat exchanger 202 can be positioned at the top of the electronic rack. In which case, the airflow within front aisle 223 would flows downwardly while the airflow within back aisle 224 would flows upwardly. In other embodiments, A/L heat exchanger 202 can be positioned in any of the slots.

According to one embodiment, electronic rack 200 further includes a bypass mechanism 215 disposed between rack supply line 211 and rack supply manifold 213. Bypass mechanism 215 is configured to receive cooling liquid from rack supply line 211 and to supply the cooling liquid to rack supply manifold 213 directly without having to go through A/L heat exchanger 202. In one embodiment, bypass mechanism 215 is turned on to bypass A/L heat exchanger 202 when A/L heat exchanger 202 is unavailable, for example, during maintenance services or malfunction of A/L heat exchanger 202.

In normal operations, cooling liquid provided by rack supply line 211 typically flows through A/L heat exchanger before entering rack supply manifold 213. When A/L heat exchanger 202 is unavailable, bypass mechanism 215 is turned on to allow the cooling liquid flowing through bypass mechanism 215 to reach rack supply manifold 213 directly. A schematic diagram illustrating the bypass configuration is shown in FIG. 4 according to one embodiment.

Figure 3:
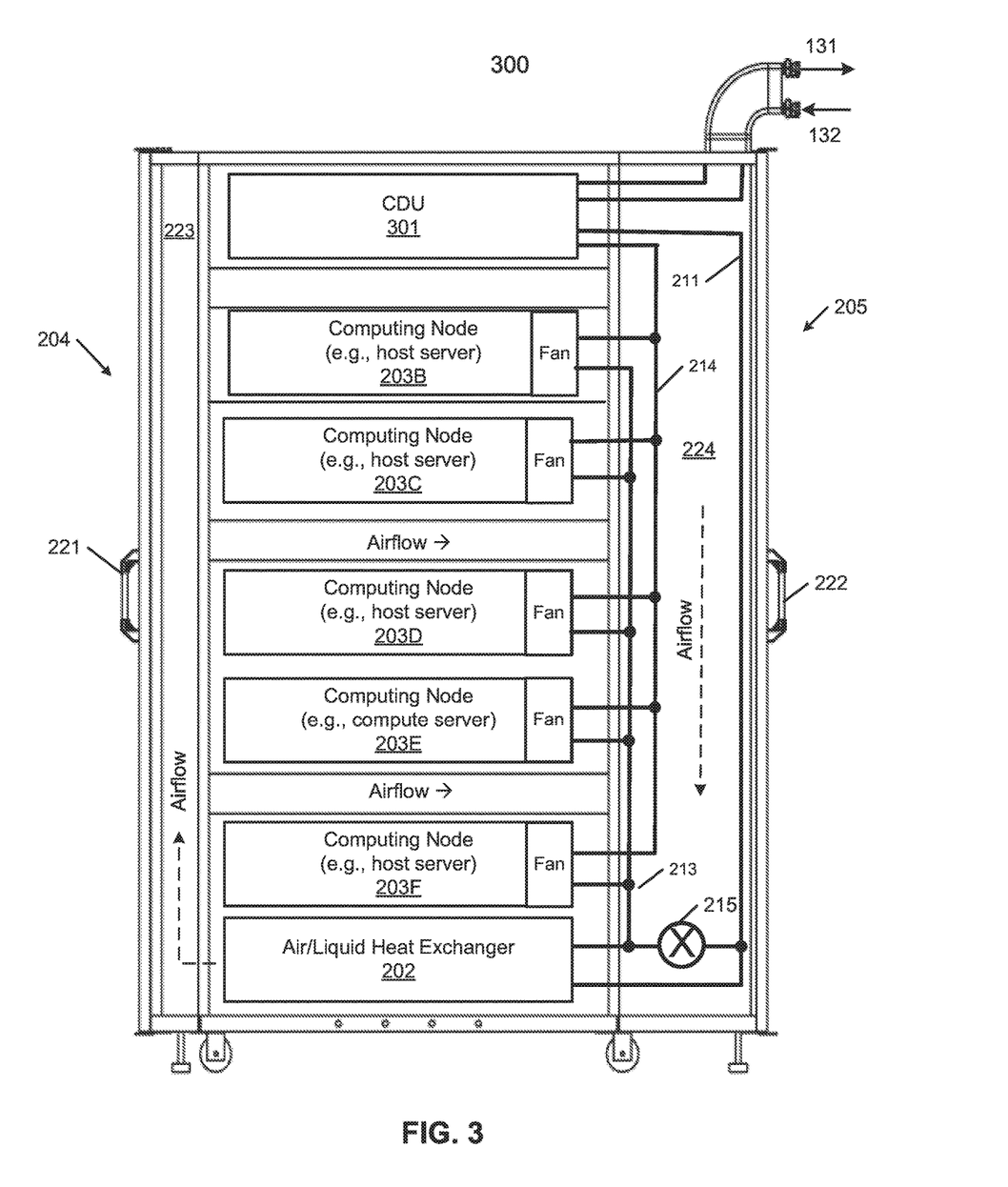
FIG. 3 is a block diagram illustrating an example of an electronic rack according to another embodiment.
Figure 4:
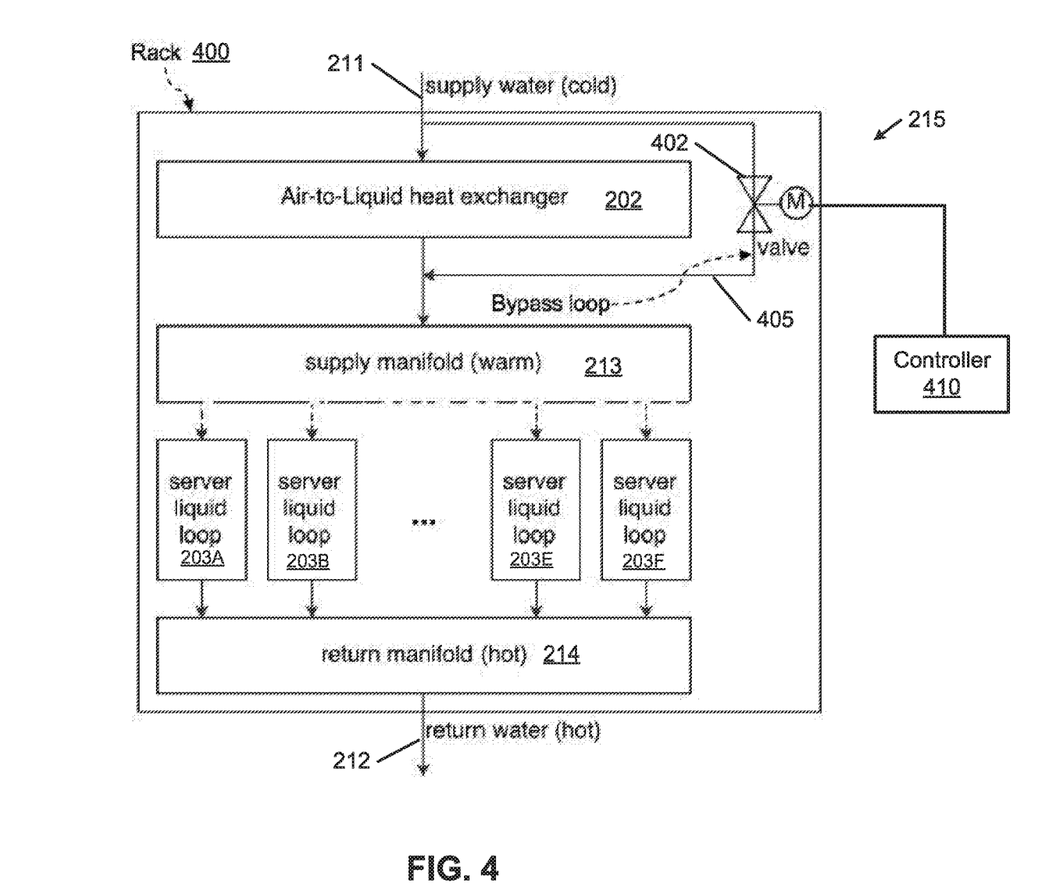
FIG. 4 is a schematic diagram illustrating a bypass mechanism of an electronic rack according to one embodiment.

Referring now to FIG. 4, electronic rack 400 may represent electronic rack 200 of FIGS. 2A-2B and 3. Bypass mechanism 215 includes a liquid valve or switch 402 and bypass manifold or loop 405 coupled to rack supply line 211 and rack supply manifold 213. Switch 402 is controlled by controller 410 that can turn on or turn off switch 402 to allow the cooling liquid to pass through from rack supply line 211 to rack supply manifold 213, bypassing A/L heat exchanger 202. According to one embodiment, controller 410 is configured to detect whether A/L heat exchanger 202 is available or operating properly. In response to determining that A/L heat exchanger 202 is unavailable or malfunctions, controller 410 sends a control command or signal to turn on switch or valve 402 to allow the cooling liquid to flow through.

In one embodiment, controller 410 may detect that A/L heat exchanger 202 has been disconnected from rack supply line 211, e.g., A/L heat exchanger 202 has been removed from the corresponding slot of the electronic rack for maintenance services. In such a situation, there would be no cooling liquid supplied to server liquid loops 203A-203F. In response to the detection, controller 410 is configured to turn on switch 402 to allow the cooling liquid to flow through bypass loop 405 to reach server liquid loops 203A-203F for providing liquid cooling.

According to another embodiment, controller 410 may detect that either front panel 221 or back panel 222 has been opened. In such a situation, front aisle 223 or back aisle 224 no longer exists and circular airflows are not formed. Therefore there is no need to perform air cooling and thus, there is no need for A/L heat exchanger 202. In response, controller 410 may turn on switch 402 and bypass loop 405 to bypass A/L heat exchanger 202.

According to a further embodiment, controller 410 may control the liquid flow rate of bypass loop 405 based on the liquid temperature of rack supply manifold 213, temperature of rack return manifold 214, and/or airflow temperature to balance the liquid flows going through A/L heat exchanger 202 and bypass loop 405 to achieve the optimal air and liquid cooling of the electronic rack.

FIG. 3 is a block diagram illustrating an electronic rack according to another embodiment. Referring to FIG. 3, in this embodiment, in addition to the cooling liquid manifold configuration as described above with respect to FIGS. 2A-2B, electronic rack 300 further includes a local CDU 301. The primary loop of CDU 301 is coupled to main supply manifold 132 and main return manifold 131. The secondary loop of CDU 301 is coupled to rack supply line 211 and rack return line 212. Note that the configuration of FIG. 3 is shown for illustration purpose only. Other configuration may exist. For example, CDU 301 may be located at the bottom while A/L heat exchanger 202 may be located on the top of electronic rack 300.

Figure 5:
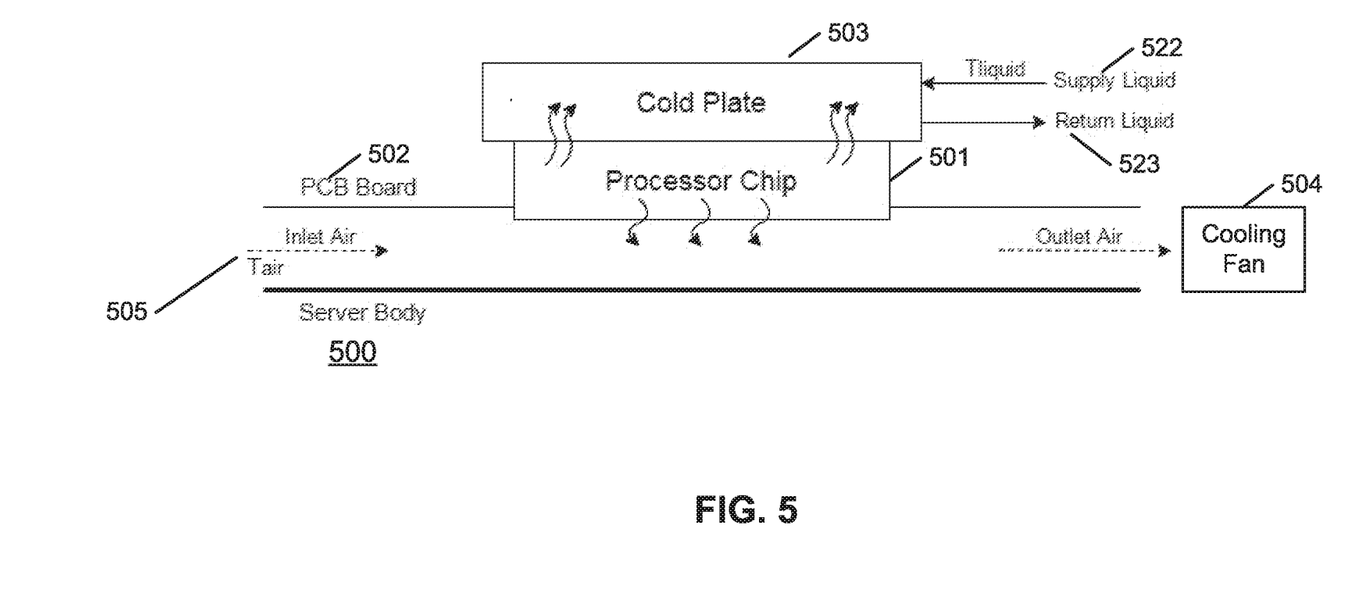
FIG. 5 is a block diagram illustrating an example of a server blade according to one embodiment.

As described above, the liquid cooling is configured to remove most of the heat generated by higher power consumption components of the server (e.g., CPUs, GPUs), while the air cooling is configured to remove heat generated by lower power consumption components that are impractical or not feasibly removed by the liquid cooling system, such as, for example, memory, storage devices, motherboard, as well as the heat radiated from the higher power consumption components, as shown in FIG. 5.

Referring to FIG. 5, server blade 500 contains a computing node having at least one processor 501 soldered on a printed circuit board (PCB), also referred to as a motherboard of the computing node. Processor 501 is also attached to cold plate 503 having a liquid distribution loop therein. The liquid distribution loop includes an inlet 522 to receive cooling liquid from rack supply manifold 213 and an outlet 523 to return warmer liquid carrying the heat generated and exchanged from processor 501 back to rack return manifold 214. In addition, airflow 505 generated by a cooling fan flows across the airspace of the server blade 500 to remove a portion of the heat generated by processor 501 and other components disposed on motherboard 502 (e.g., memory, storage device). Thus, by combining a liquid cooling system and an air cooling system, the individual fans normally mounted on the server blades or the electronic racks may not be needed. However, power supply units and/or network equipment of an electronic rack may still need to be cooled by air if necessary.

Figure 6:
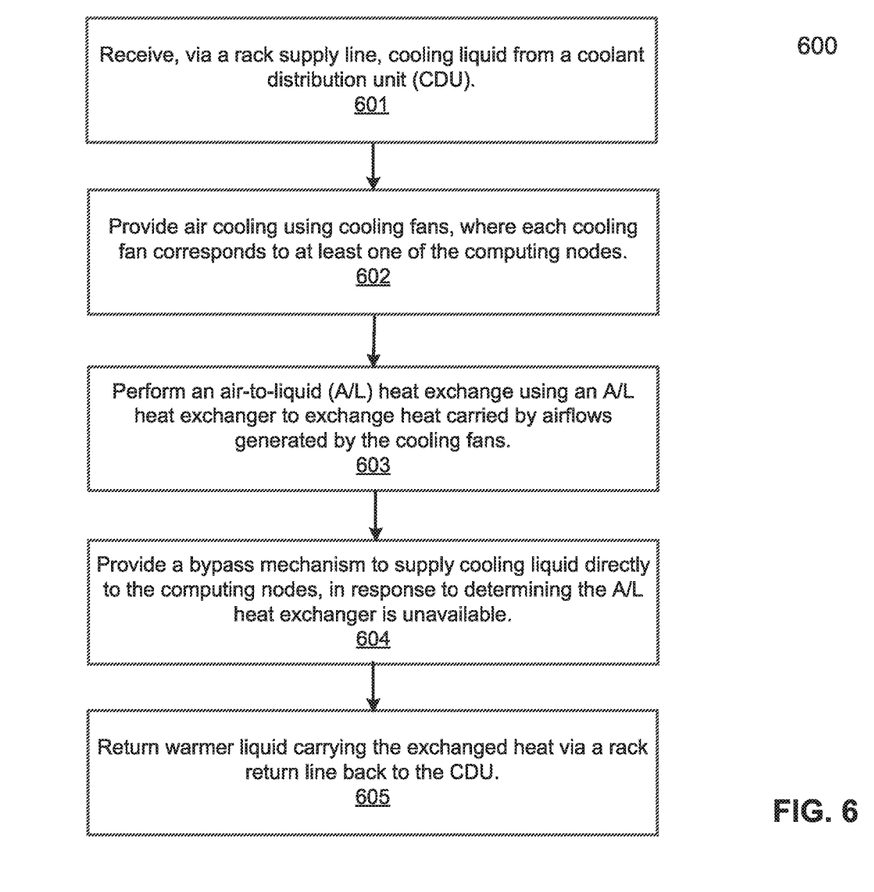
FIG. 6 is a flow diagram illustrating a process of providing air and liquid cooling to an electronic rack according to one embodiment.

FIG. 6 is a flow diagram illustrating a process of providing air and liquid cooling to an electronic rack according to one embodiment. Process 600 may be performed by systems as shown in FIGS. 2A-2B and 3. Referring to FIG. 6, in operation 601, cooling liquid is received from a CDU via a rack supply line, where the CDU may be external to the electronic rack or within the electronic rack. In operation 602, airflows are generated using one or more cooling fans to provide air cooling to the computing nodes arranged in a stack within the electronic rack. Each cooling fan is associated with at least one of the computing nodes, where a cooling fan may be mounted on the back of the server blades and/or backend of the electronic rack. In operation 603, an A/L heat exchange is performed to exchange, using an A/L heat exchanger, the heat carried by the airflows that are generated by the cooling fans. In operation 604, a bypass mechanism is provided to supply the cooling liquid directly to the computing nodes, in response to detecting that the A/L heat exchanger is unavailable (e.g., disconnected from the rack supply manifold, doors of the electronic racks are opened). In operation 605, warmer liquid carrying the exchanged heat is returned back to the CDU via a rack return line.

Figure 7:
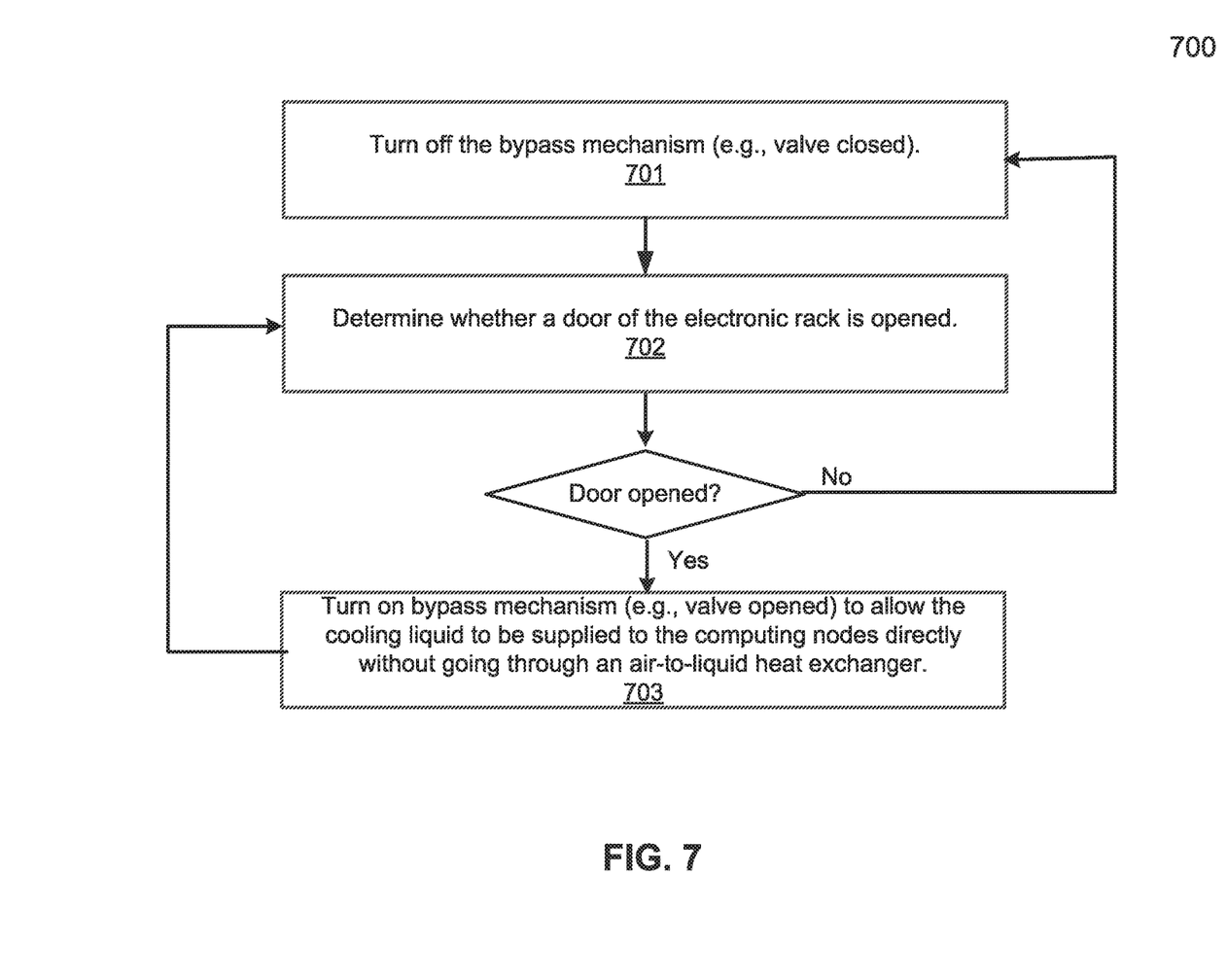
FIG. 7 is a flow diagram illustrating a process of providing air and liquid cooling to an electronic rack according to another embodiment.

FIG. 7 is a flow diagram illustrating a process of providing air and liquid cooling to an electronic rack according to another embodiment. Process 700 may be performed as a part of operation 604 of FIG. 6. Referring to FIG. 7, in operation 701, the system of an electronic rack is turned on, including the computing nodes disposed therein. In operation 702, processing logic determines whether a door of the electronic rack is opened. If it is determined that the door of the electronic rack is opened, in operation 703, processing logic turns on the bypass mechanism to allow the cooling liquid to be supplied to the computing nodes directly, without having to go through an A/L heat exchanger.

Note that the cooling techniques described above can be applied to a variety of different types of data centers, such as, for example, traditional colocation data centers, brownfield data centers, and greenfield data centers. A colocation data center is a type of data center where equipment, space, and bandwidth are available for rental to retail customers. Colocation facilities provide space, power, cooling, and physical security for the server, storage, and networking equipment of other firms, and connect them to a variety of telecommunications and network service providers with a minimum of cost and complexity. A greenfield data center refers to a data center that is built and configured in a location where none exists before. The techniques described above can also be applied to or work in conjunction with a performance optimized data center (POD), or portable on-demand or container data center, where racks of servers are housed in one or more individual containers, modular rooms, or modular housings.

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

In the foregoing specification, embodiments of the invention have been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. An electronic rack used in a data center, comprising:
    a housing to house a front panel, a back panel, and a plurality of computing nodes arranged in a stack, each computing node containing at least one processor attached to a liquid cold plate, wherein a front aisle is formed between the front panel and the stack of computing nodes, and a back aisle is formed between the back panel and the stack of computing nodes;
    a plurality of cooling fans, each of the cooling fans corresponding to at least one of the computing nodes to provide air cooling to the corresponding computing node, wherein each cooling fan generates an airflow flowing through an airspace of the computing node;
    a rack supply line to receive cooling liquid from a coolant distribution unit (CDU);
    a rack return line coupled to each of the computing nodes to receive and return warmer liquid carrying at least a portion of heat from the computing node back to the CDU; and
    an air-to-liquid (A/L) heat exchanger located underneath the stack of computing nodes at a bottom of the electronic rack and coupled to the rack supply line to receive the cooling liquid, to exchange heat carried by the airflows generated by the cooling fans using the cooling liquid, and then to distribute the cooling liquid to each of the computing nodes to provide liquid cooling to a corresponding processor via a corresponding liquid cold plate;
    wherein the airflows are to flow from the A/L heat exchanger into the front aisle as cool airflows, to flow across the airspaces of the computing nodes to exchange at least a portion of the heat generated by the computing nodes, to enter the back aisle as warmer airflows carrying the exchanged heat, and to circulate back to the A/L heat exchanger.

2. The electronic rack of claim 1, further comprising a bypass mechanism to receive the cooling liquid from the rack supply line and to provide the cooling liquid directly to the computing nodes without going through the A/L, heat exchanger.

3. The electronic rack of claim 2, wherein the cooling liquid flows through the bypass mechanism when the A/L, heat exchanger is disconnected from the rack supply line.

4. The electronic rack of claim 2, further comprising:
    a rack supply manifold coupled to an output of the A/L heat exchanger to receive and to distribute the cooling liquid to cold plates of the computing nodes, wherein an input of the A/L, heat exchanger is coupled to the rack supply line; and
    a rack return manifold coupled to the cold plates of the computing nodes and the rack return line, wherein the rack return manifold is to receive the warmer liquid from the cold plates and to return the warmer liquid to the rack return line.

5. The electronic rack of claim 4, wherein the bypass mechanism comprises:
    a switch configured to control the cooling liquid to flow either through the A/L, heat exchanger or directly to the rack supply manifold bypassing the A/L, heat exchanger;
    wherein the bypass logic is coupled to the switch to control the switch to allow the cooling liquid to go through the A/L, heat exchanger or directly to the rack supply manifold.

6. The electronic rack of claim 5, wherein the bypass logic is configured to detect whether a door of the housing is opened, and wherein in response to determining that the door of the housing is opened, the bypass logic causes the switch to allow the cooling liquid flowing directly to the rack supply manifold without going through the A/L heat exchanger.

7. The electronic rack of claim 1, wherein the airflows flow upwardly within the front aisle, and wherein the airflows flow downwardly within the back aisle.

8. The electronic rack of claim 1, wherein the CDU is located within the electronic rack.

9. The electronic rack of claim 1, wherein at least a portion of the cooling fans are mounted on a backend of the housing to cause the airflows flowing from a frontend of the housing to the backend of the housing.

10. A data center, comprising:
    an array of electronic racks, each of the electronic racks including
        a housing to house a front panel, a back panel, and a plurality of computing nodes arranged in a stack, each computing node containing at least one processor attached to a liquid cold plate, wherein a front aisle is formed between the front panel and the stack of computing nodes, and a back aisle is formed between the back panel and the stack of computing nodes,
        a plurality of cooling fans, each of the cooling fans corresponding to at least one of the computing nodes to provide air cooling to the corresponding computing node, wherein each cooling fan generates an airflow flowing through an airspace of the computing node, a rack supply line to receive cooling liquid from a coolant distribution unit (CDU), a rack return line coupled to each of the computing nodes to receive and return warmer liquid carrying at least a portion of heat from the computing node back to the CDU, an air-to-liquid (A/L) heat exchanger located underneath the stack of computing nodes at a bottom of the electronic rack and coupled to the rack supply line to receive the cooling liquid, to exchange heat carried by the airflows generated by the cooling fans using the cooling liquid, and then to distribute the cooling liquid to each of the computing nodes to provide liquid cooling to a corresponding processor via a corresponding liquid cold plate, and wherein the airflows are to flow from the A/L heat exchanger into the front aisle as cool airflows, to flow across the airspaces of the computing nodes to exchange at least a portion of the heat generated by the computing nodes, to enter the back aisle as warmer airflows carrying the exchanged heat, and to circulate back to the A/L heat exchanger.

11. The data center of claim 10, wherein each electronic rack further comprises a bypass mechanism to receive the cooling liquid from the rack supply line and to provide the cooling liquid directly to the computing nodes without going through the A/L, heat exchanger.

12. The data center of claim 11, wherein the cooling liquid flows through the bypass mechanism when the A/L, heat exchanger is disconnected from the rack supply line.

13. The data center of claim 11, wherein each electronic rack further comprises:
a rack supply manifold coupled to an output of the A/L heat exchanger to receive and to distribute the cooling liquid to cold plates of the computing nodes, wherein an input of the A/L, heat exchanger is coupled to the rack supply line; and
a rack return manifold coupled to the cold plates of the computing nodes and the rack return line, wherein the rack return manifold is to receive the warmer liquid from the cold plates and to return the warmer liquid to the rack return line.

14. A method of providing cooling to an electronic rack, the method comprising: receiving, via a rack supply line disposed within an electronic rack, cooling liquid from a coolant distribution unit (CDU), wherein the electronic rack contains a front panel, a back panel, and a plurality of computing nodes arranged in a stack, each computing node containing at least one processor attached to a liquid cold plate, wherein a front aisle is formed between the front panel and the stack of computing nodes, and a back aisle is formed between the back panel and the stack of computing nodes;
providing air cooling using a plurality of cooling fans, each of the cooling fans corresponding to at least one of the computing nodes, wherein each cooling fan generates an airflow flowing through an airspace of the computing node;
performing an air-to-liquid (A/L) heat exchange using an A/L heat exchanger coupled to the rack supply line and located underneath the stack of computing nodes at a bottom of the electronic rack, wherein the A/L heat exchanger is to receive the cooling liquid from the rack supply line, to exchange heat carried by the airflows generated by the cooling fans using the cooling liquid, and then to distribute the cooling liquid to each of the computing nodes to provide liquid cooling to a corresponding processor via a corresponding liquid cold plate, wherein the airflows are to flow from the A/L heat exchanger into the front aisle as cool airflows, to flow across the airspaces of the computing nodes to exchange at least a portion of the heat generated by the computing nodes, to enter the back aisle as warmer airflows carrying the exchanged heat, and to circulate back to the A/L heat exchanger; and
returning warmer liquid via a rack return line coupled to each of the computing nodes to receive back to the CDU, the warmer liquid carrying at least a portion of heat from the computing node;
detecting, by a bypass logic, whether the A/L heater exchanger is disconnected from the rack supply line.

15. The method of claim 14, further comprising:
detecting that the A/L, heat exchanger is unavailable; and
in response to the detection, providing the cooling liquid from the rack supply line directly to the computing nodes without going through the A/L heat exchanger.

16. The method of claim 15, wherein the cooling liquid is directly provided to the computing nodes when the A/L, heat exchanger is disconnected from the rack supply line.

17. The electronic rack of claim 5, wherein the bypass logic is configured to detect whether the A/L heat exchanger is disconnected from the rack supply line, and wherein in response to determining that the A/L heat exchanger is disconnected from the rack supply line, the bypass logic causes the switch to allow the cooling liquid flowing directly to the rack supply manifold without going through the A/L heat exchanger.

18. The data center of claim 10, further comprising a bypass logic configured to detect whether the A/L heater exchanger is disconnected from the rack supply line, and, in response to detecting that the A/L heater exchanger is disconnected from the rack supply line, to enable the cooling liquid to bypass the A/L heat exchanger.

19. The method of claim 14, further comprising
In response to detecting that the A/L heater exchanger is disconnected from the rack supply line, to enable the cooling liquid to bypass the A/L heat exchanger, providing the cooling liquid directly to the computing nodes to bypass the a/L heat exchanger.

* * * * *